(12) United States Patent
Wu et al.

(10) Patent No.: US 6,941,497 B2
(45) Date of Patent: Sep. 6, 2005

(54) N-SQUARED ALGORITHM FOR OPTIMIZING CORRELATED EVENTS

(75) Inventors: Kang Wu, Fort Collins, CO (US); Susan L. Stirrat, Windsor, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 584 days.

(21) Appl. No.: 10/047,344

(22) Filed: Jan. 15, 2002

(65) Prior Publication Data

US 2003/0140287 A1 Jul. 24, 2003

(51) Int. Cl.[7] ............................................. G01R 31/28

(52) U.S. Cl. ....................... 714/724; 714/742; 324/765

(58) Field of Search ................................ 714/724, 742; 324/765

(56) References Cited

U.S. PATENT DOCUMENTS

| | | | | |
|---|---|---|---|---|
| 5,345,450 A | * | 9/1994 | Saw et al. | 714/741 |
| 5,935,264 A | | 8/1999 | Nevill et al. | |
| 6,256,593 B1 | * | 7/2001 | Damon et al. | 702/84 |
| 6,782,501 B2 | * | 8/2004 | Distler et al. | 714/738 |
| 6,810,372 B1 | * | 10/2004 | Unnikrishnan et al. | 703/13 |

FOREIGN PATENT DOCUMENTS

EP 1132749 A 9/2001

OTHER PUBLICATIONS

Coudert, Olivier, "On Solving Covering Problems", 33rd Design Automation Conference, Proceedings 1996 (IEEE Cat. No.96CH35932), Proceedings of 33rd Design Automation Conference, Las Vegas, NV, USA, Jun. 3–7, 1996, New York, NY, USA, ACM, USA, pp. 197–202. XP002246–016 ISBN: 0–89791–779–0.

Fallah, Farzan et al, "Solving Covering Problems Using LPR–Based Lower Bounds", IEEE Trans. Very Large Scale Integr. (VLSI) Syst. (USA), IEEE Transactions on Very Large Scale Integration (VLSI) Systems, Feb. 2000, IEEE, USA, vol. 8, No. 1, pp. 9–17, XP002246015 ISSN: 1063–8210.

Coudert, Olivier, "Solving Graph Optimization Problems with ZBDDs", European Design and Test Conference, 1997, ED&TC 97, Proceedings Paris, France Mar. 17–20, 1997, Los Alamitos, CA, USA, IEEE Comput. Soc, US, pp. 224–228. XP010218503 ISBN: 0–8186–7786–4.

Brosa, Anna M et al, "On Maximizing the Coverage of Catastrophic and Parametric Faults", European Test Workshop 1999 (CAT. No.PR00390), European Test Workshop 1999, Constance, Germany, May 25–28, 1999, 1999, Los Alamitos, CA, USA, IEEE Comput. Soc, USA, pp. 123–128. XP002246017 ISBN: 0–7695–0390–X.

* cited by examiner

*Primary Examiner*—Albert Decady
*Assistant Examiner*—Esaw Abraham

(57) ABSTRACT

An $N^2$ algorithm for optimizing correlated events, applicable to the optimization of the detection of redundant tests and inefficient tests (RIT's), is disclosed. This algorithm represents a set of N tests with L defects as N L-dimensional correlation vectors. The $N^2$ algorithm optimizes in terms of the minimum set of vectors, and the set of vectors that take the minimum time to detect the L defects. The minimum set optimization determines a set of vectors (tests) that contains the minimum number of vectors (tests) by analyzing the correlation among the N vectors. This minimum set optimization provides the minimum test set containing all defects in an algorithm that takes $O(N^2)$ operations. The minimum time optimization determines a sequence of vectors (tests) that will detect the defects in a minimum amount of time. Taking into the account of the different execution time of each vector (test), the algorithm analyzes the complicated correlation among the vectors (tests) and gives an optimized sequence of vectors (tests) within $O(N^2)$ operations. The optimized sequence of vectors (tests) takes a minimum amount of time to find all the defects.

13 Claims, 2 Drawing Sheets

N-SQUARED ALGORITHM FOR OPTIMIZING CORRELATED EVENTS

TECHNICAL FIELD

This invention relates generally to the field of integrated circuit systems, and more specifically to the detection of defects in digital integrated circuits.

BACKGROUND OF THE INVENTION

An important aspect of the manufacture of integrated circuits (IC's) is the post-production testing process. The goal of the post-production testing process is to apply test inputs to a device and determine if the device is defective. Preferably, this defect detection process occurs as early point as possible since further integration of faulty components rapidly becomes very expensive. Consider for example, attempting to determine the location of a faulty IC in a personal computer system. There are several different kinds of tests that can be applied to IC defect testing. Exhaustive tests seek to apply every possible input in order to determine if any defects are present in the IC. Functional testing tests the functions present on the IC for correct operation. The fault model test determines each type of fault that is likely to occur, and devises tests for these common faults. The exhaustive test can be the most time-consuming and may also be expensive. Functional testing is problematic in that the test design must accurately ensure that all functionality is correctly tested. Functionality testing requires application specific knowledge to ensure that all incorporated functionality has been tested. Fault modeling will detect the faults assumed within the framework of the fault model. An example of the fault model is the stuck-at fault model. This model assumes a limited number of faults and assumes that the faults are permanent.

A well-designed test plan should use the least number of test inputs to cover the most number of defects or defective dice (DD's), and the test plan should be designed so that a test sequence is executed in an efficient fashion. Many of the exhaustive, functional, and fault models are based upon RTL and schematics. Thus the influence of the physical layout of the IC and the manufacture process (PLMP) on the defect creation in IC circuits is not exploited in the test strategy. The lack of relation between the test input data creation and the PLMP makes these methods susceptible to having redundant tests and performing a test inefficiently. The number of redundant tests and inefficient tests (RIT's) is a valuable parameter to consider when designing test plans, since there is a strong benefit in terms of reducing test execution time and test complexity when the number of RIT's are reduced. Current strategies that reduce the number of RIT's seek to eliminate the execution of redundant tests in the IC testing process using the same exhaustive, functional, and fault model strategies used in IC standardized IC testing.

Eliminating redundant tests and reordering tests to increase the test efficiency has become an important area of research as the IC test becomes increasingly expensive. In IC testing, tests are generated using simulations and other means. Evaluating the tests is important for increasing test efficiency and reducing test time. Efficient numerical algorithms for analyzing the test redundancy and the test sequence efficiency are required to meet the need for IC test time reduction techniques.

Thus, there is an unmet need in the art for an efficient numerical algorithm for analyzing a given test sequence redundancy and efficiency.

SUMMARY OF THE INVENTION

This invention discloses an $N^2$ algorithm for optimizing IC tests. The test optimization of the present invention refers to minimizing the amount of time spent on RIT's. The method of the present invention uses the IC simulation data or IC production test data. The simulation data contains the relation between tests and defects. The IC production data reflects the PLMP and gives the relation between tests and DD's. Both of the data can then be processed to detect RIT's in IC tests. The test optimization can occur on the defect (fault) level using IC simulation data and the DD level using IC production data. The optimization process is the same for both defects (faults) and DD's, so only one approach will be described here.

The test optimization problem may be described as follows: Given N tests in a test sequence and L DD's, each of the N tests detects between 1 and L of the L DD's. And each test takes a certain amount of time to be executed. The first part of the test optimization problem determines the set of tests which takes the minimum number of tests to detect all the L DD's. The second part of the test optimization problem determines the set of tests and the execution sequence of the tests that takes the minimum time to detect all the DD's.

Both test optimization problems can be framed in terms of representing N tests as N vectors. Each of the N vectors has L components, corresponding to the L DD's. For each of the N tests, we create a correlation vector, V. For test i, we have $$V(i)=(v_1(i), v_2(i), \ldots, v_L(i)),$$

where $v_j(i)$ is equal to zero if test i does not detect DD j and is equal to one if test i detects DD j. After representing each test as a correlation vector, each test can be treated as an event in a correlated event problem. The execution time of a test can be treated as the time taken by the corresponding event. The list of DD's that a test detects is the correlation vector for the test. Therefore, the test optimization problem is the same as the minimum set optimization and the minimum time optimization problems of correlated events.

Both parts of the test optimization problem can take on the order of N! operations to determine the optimum set. A vector projection technique is used to calculate the correlation between the N correlation vectors. This projection technique requires on the order of $N^2$ operations to optimize the correlated event problem.

The following algorithm takes on the order of $N^2$ operations to determine the minimum set in which each test is represented as a correlation vector:

a. Choose a correlation vector in the N vectors such that the correlation vector contains the most number of non-zero components. Assign this vector to vector W. Store this vector.

b. Determine a correlation vector of the remaining correlation vectors such that the length of the projection of the multiplication of W and the complement of the vector onto the unit vector is the smallest.

c. Store this vector, and update W to be the multiplication of W and the complement of this vector. Repeat the previous step b until the projection of W onto the unit vector becomes zero.

The following algorithm takes on the order of $N^2$ operations to determine the minimum time:

Represent each test as a correlation vector.

a. Choose a correlation vector in the N vectors such that the vector has the largest value of the number of non-zero components divided by the time associated with the vector. Multiply the complement of this vector with the unit vector and form a vector W. Store this vector.

b. Determine a correlation vector of the remaining correlation vectors such that the length of the projection of the vector onto vector W divided by the time associated with the vector is the largest.

c. Store this vector, and update W to be the multiplication of W and the complement of this vector. Repeat the previous step b until the projection of vector W onto the unit vector becomes zero.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
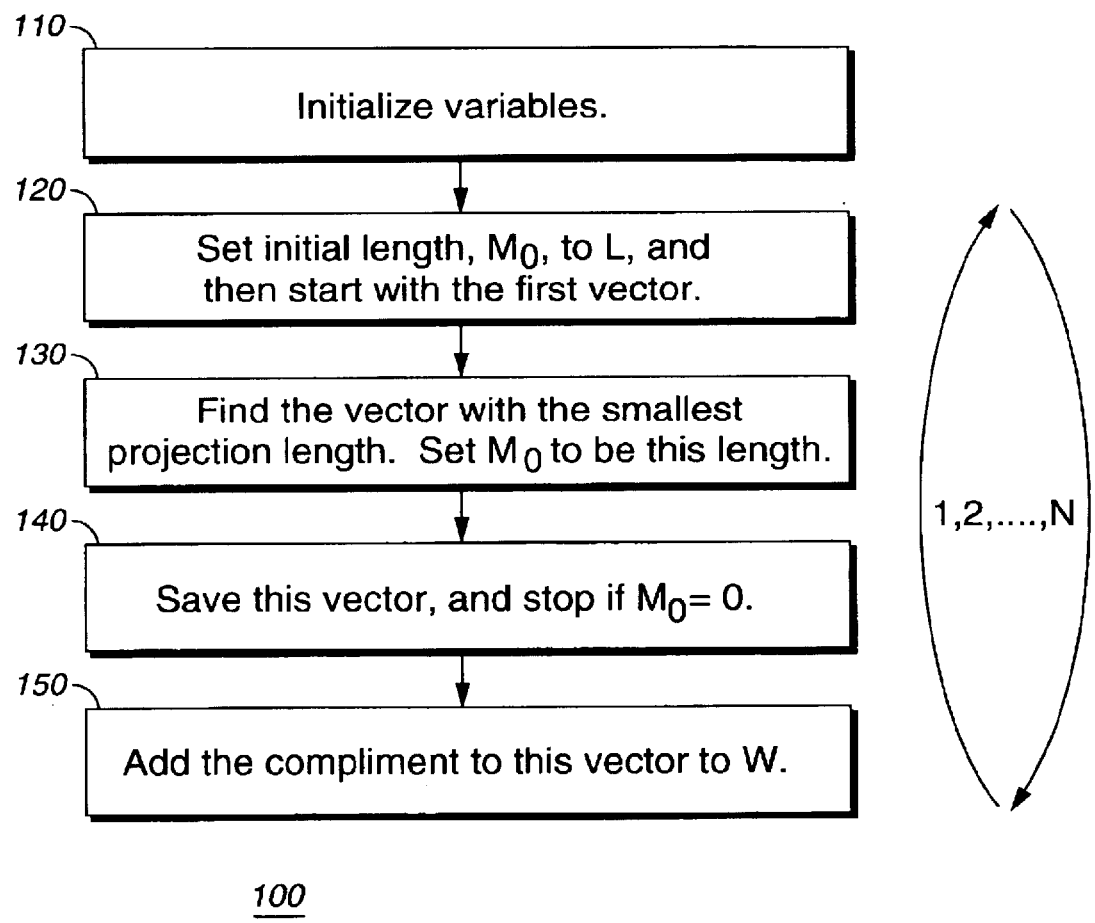
FIG. 1 is a block diagram of a minimum set optimization method, according to an embodiment of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

The disclosed algorithm for optimizing correlated events is applied to the problem of analyzing redundant tests and reordering tests. Thus, as will be shown below, the problem of analyzing redundant tests and reordering tests is equivalent to analyzing correlated events. The description of this invention contains three parts: The formulation for correlated events, the algorithm for optimizing the correlated event problem, and the mapping between the correlated event optimization problem and the related test optimization problem.

Correlated Events

Consider N events that may occur in any sequence. Number the N events using integers from 1 to N. If the N events are correlated, the occurrence of some of the events depends on the occurrence of other events. For example, consider N=5. The correlation among the five events may be the following:

1) If events 2, 4 and 5 take place before events 1 and 3, then events 1 and 3 will not occur.

2) If events 1 and 5 take place before events 2, 3 and 5, then events 2, 3, and 5 will not occur.

Conditions 1) and 2) define the correlation among the five events in this example.

In the N correlated events, there is at least one such set of events that their occurrence prevents other events from occurring. In general, there exists more than one such set of events. Such a set of events is called a minimum set. The problem of finding the minimum set of events is referred to as a minimum set optimization problem. In the above example, events 1 and 5, are the minimum set. Finding the minimum set of a collection of events is difficult in general because the correlation among events is defined implicitly and the value of N is often large. Therefore, the complexity of the computation for finding a minimum set is very high.

To formulate the correlation among N events, we represent each of the N events as a binary vector in an L-dimensional correlation space. Each of the components of a binary vector is (0,1) valued. The binary vectors are called correlation vectors. Let V(i) be the correlation vector associated with event i. Then, $$V(i)=(v_1(i), v_2(i), \ldots, v_L(i))$$

where $v_j(i)$ is the jth component of correlation vector V(i) and is (0,1)-valued. To describe the correlation among the N events, we need to define the operations of the multiplication, addition, and complement of correlation vectors. Define multiplication of correlation vectors V(i) and V(j) to be $$V(i)V(j)=(v_1(i)\&v_1(i), v_2(i)\&v_2(i), \ldots, v_L(i)\&v_L(i)),$$

where & is the Boolean AND operator. Define the addition of correlation vectors V(i) and V(j) to be $$V(i)+V(j)=(v_1(i)|v_1(i), v_2(i)|v_2(i), \ldots, v_L(i)|v_L(i)),$$

where | is the Boolean OR operator. Finally, define the complementary vector of correlation vector V(i), V(i)' to be the complement of the individual components.

Let I be the unit correlation vector. All the components of the unit correlation vector are one. The correlation among the N events is defined to be that the occurrence of events $i_1, i_2, \ldots, i_a$ prevents the occurrence of events $i_{a+1}, \ldots, i_L$ if $$\sum_{j=1}^{a} V(i_j) = I, \qquad (1)$$

where 1<=a<=L, 1<=$I_j$<=N, $i_j I = i_k$ and 1<=j, k<=L. This equation can also be written as $$\prod_{j=1}^{a} V(i_j)' = I' \qquad (2)$$

The correlation vectors determine the correlation among the N events through equation (1) or equation (2). The minimum set optimization is to find a set of events so that the value of the variable a in equation (1) or equation (2) reaches it's minimum.

In a more general case, each event is associated with a time. Let t(i) be the time that event i takes. Then the total time T that events $i_1, i_2, \ldots, i_a$ take is $$T(i_1, i_2, \ldots, i_a) = \sum_{j=1}^{a} t(i_j) \qquad (3)$$

The minimum time optimization problem is to find a set of events so that the total time T reaches it's minimum. This problem is called minimum time optimization. If all the t(i)'s are equal, then this problem reduces to the minimum set optimization problem.

From the formulation of correlated events above, we can see that the values of N and L determine the complexity of the correlation. In practice, the values of N and L are large, so that the optimization problem can be intractable.

Minimum Set Optimization Problem

If an exhaustive search is performed, the computation across N events requires O(N!) operations, so that this method is not practical for large values of N. The following minimum set optimization algorithm is $O(N^2)$.

Define $P_A(B)$ to be the square of the length of the projection of correlation vector B onto correlation vector A. So $$P_A(B) = \sum_{i=1}^{L} a_i \cdot b_i$$

Define $W(i_1, i_2, \ldots, i_k)$ to be $$W(i_1, i_2, \ldots, i_k) = I \prod_{j=1}^{k} (V(i_j))'.$$

With this definition, $P_I(W(i_1, i_2, \ldots, i_a)) = P_I(I') = 0$. By definition, for a given W, $P_I(W) \geq 0$ and is a decreasing function of k in W. That is, adding a correlation vector to W decreases $P_I(W)$. In the process of searching a minimum set, if we keep the value of $P_I(W)$ to be as small as possible while adding correlation vectors to W, then the set of events in W will approach a minimum set. Assume that a set of correlation vectors $V(i_1), V(i_2), \ldots, V(i_k))$ in the N vectors is chosen such that $P_I(W)$ is a minimum. As we add additional vectors to W from the remaining N–k vectors while we keep $P_I(W)$ to the minimum, we will eventually reach $P_I(W)=0$. This set of vectors in W will represent the minimum set. Referring to FIG. 1, and the following pseudo-code, the minimum time optimization algorithm is summarized:

```
U(i) = minimum set; W = I; n = 1;// block 110
for (I=1;I<=N;I++)
    {
    M0 = L and i0 = 1 // block 120
    for (j=i;j<=N;j++)
        {
        // start block 130
        M = P1(W*V(j)');
        if (M <= M0)
            {
            M0 = M;
            i0 = j;
            }
        // end block 130
        }
    // start block 140
    U(n) = V(i0);
    if (M0 == 0)
        stop;
    // end block 140
    // start block 150
    W = WU(n)';
    n=n+1;
    // end block 150
    }
```

Minimum Time Optimization

In this problem, it is necessary to include the changes to $P_I(W)$ and the changes to time T by $t(I_k+1)$ when we add the (k+1)th correlation vector into W. First note that, $$P_A(B) = P_B(A) \quad (4)$$

and $$P_A(I) = P_A(B+B') = P_A(B) + P_A(B') \quad (5)$$

Using equations (4) and (5), one can readily obtain $$P_{W(i1, i2, \ldots, ik)}(V(i_{k+1})) = -[P_I(W(i_1, i_2, \ldots, i_{k+1})) - P_I(W(i_1, i_2, \ldots, i_k))].$$

Figure 2:
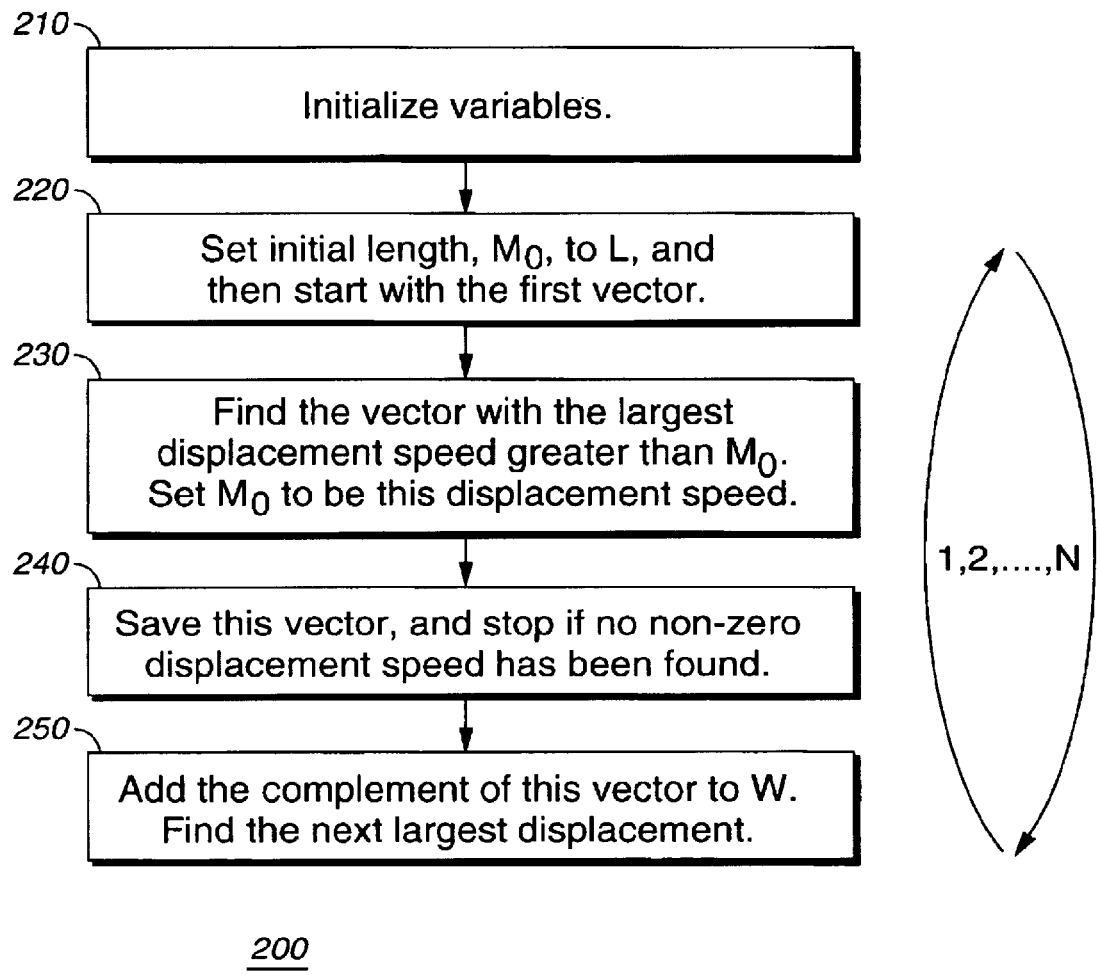
FIG. 2 is a block diagram of a minimum time optimization method, according to an embodiment of the present invention.

From this equation, it is seen that $P_{W(i1, i2, \ldots, ik)}(V(i_{k+1}))$ is an amount of the decrement of $P_I(W)$ after adding a (k+1)th correlation vector into W. It is possible to treat the value of $P_{W(i1, i2, \ldots, ik)}(V(ik+1))$ as a measure of a displacement of $P_I(W)$ towards 0 after time $t(i_{k+1})$ is taken by event $(i_{k+1})$. Then, the quantity $P_{W(i1, i2, \ldots, ik)}(V(i_{k+1}))/t(i_{k+1})$ is the measure of the speed of $P_I(W)$ towards 0 when event vector $V(i_{k+1})$ is added into W. If we choose the (k+1)th event such that the value of $P_{W(i1, i2, \ldots, ik)}(V(i_{k+1}))/t(i_{k+1})$ is a maximum, then this selection causes the total time T to be a minimum, $T(i_1, i_2, \ldots, i_a)$. Referring to FIG. 2, and the following pseudo-code, the minimum time optimization algorithm is summarized:

```
U(i) = the minimum set of correlated events, W = I, and n = 1 // block 210
for (i=1;i<=N;i++)
    {
    M0 = 0; // block 220
    for (j=i;j<=N;j++)
        {
        // start block 230
        M = Pw(V(j))/t(j);
        if (M >= M0)
            {
            M0 = M;
            i0 = j;
            }
        // end block 230
        }
    // start block 240
    U(n) = V(i0);
    if (M0 == 0)
        stop;
    // end block 240
    W = WU(n)'; n=n+1; // block 250
    }
```

The minimum time algorithm and the minimum set algorithm contain two loops related to the number of events, N. The number of operations is proportional to $N^2$ which is much smaller than O(N!). Also, note that bit maps can be used to store the correlation vectors so that less memory is used and bit-wise operations are used to calculate W. The use of bit maps and bit-wise operations also reduce the amount of time required to execute the algorithms.

When the execution time of each test is the same, the minimum set optimization algorithm can be applied to the determination of how to remove redundant tests and reorder tests in an efficient sequence such that higher efficient tests are executed earlier. When the execution time of each test is different, the minimum time optimization algorithm can be applied to the determination of how to remove redundant tests and the efficient test execution sequence. If we associate N with the number of tests in a given test sequence, and L with the number of DD's, then we can represent the N tests as L-dimensional correlation vectors. With this assignment, it becomes possible to apply the minimum set optimization and minimum time optimization to RIT's.

While the minimum time optimization and the minimum set optimization have been applied to the RIT's, it will be clear to one of skill in the art that the minimum time optimization and minimum set optimization may be applied to other optimization problems. Examples of other optimization problems include determining DD.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method for selecting an optimal test sequence from a sequence of N tests for detecting faults in digital integrated circuits (IC's) comprising:
   for each test of the sequence of N tests, compiling test results for L defective dice, wherein said N tests comprise one or more redundant tests and one or more inefficient tests;
   representing each test of the sequence of N tests as a correlation vector of length L, such that the sequence of N tests is represented as N correlation vectors, wherein element j of correlation vector for test i is zero if device j passed test i;
   finding a first correlation vector of the N correlation vectors that has the most non-zero components and initializing a vector W to be the complement of the first correlation vector;
   selecting a first test in the optimal test sequence to be the test represented by the first correlation vector;
   for each correlation vector of the remaining N-1 correlation vectors, calculating a product of the complement of each correlation vector and the vector W;
   calculating a length of a projection of each calculated product vector onto a unit vector;
   finding a next correlation vector that is the correlation vector of the N-1 correlation vectors that has a smallest value of the projection length;
   selecting a next test in the optimal test sequence to be the test represented by the next correlation vector;
   updating the vector W to be a product of vector W and a compliment of the determined correlation vector in the previous step; and
   repeating the previous five elements, until the length of the projection of vector W onto the unit vector is zero.

2. The method of claim 1, wherein the correlation vector that has the smallest value of the projection length is stored as one of the correlation vectors in an optimized set.

3. The method of claim 2, wherein finding a vector in the optimized set of vectors further comprises determining the vector of the remaining vectors with a smallest value of the square of the length of the projection of vector W onto the unit vector.

4. The method of claim 2, wherein finding a vector of the optimized set further comprises all remaining vectors of the N correlation vectors with zero projection onto vector W representing zero defects.

5. The method of claim 1, wherein each correlation vector is represented using a binary-valued L-dimensional vector.

6. The method of claim 1, wherein a multiplication of two vectors is defined to be a vector which components are calculated from the logical AND operation of the corresponding components of the two vectors.

7. The method of claim 1, wherein the execution time of each test is the same.

8. The method of claim 1, wherein prior to compiling the N tests, executing the sequence of N tests without stopping at a failing test.

9. The method of claim 1, further comprising analyzing the correlation among the N tests by representing each test of the n tests in a L-dimensional defective die space using a binary-valued L-dimensional vector.

10. The method of claim 1, further comprising obtaining an optimized set by sorting the projection lengths of the N correlation vectors in a descending order.

11. A method for reordering a sequence of N tests for detecting faults in digital integrated circuits (IC's) as an optimal sequence of tests when the execution time of each test is the same, comprising:
   for each test of the a sequence of N tests, compiling test results for L defective dice;
   representing each test of the sequence of N tests as a correlation vector using a binary-valued L-dimensional vector, wherein bit j of correlation vector for test i is zero if device j passed test i; finding a first correlation vector of the N correlation vectors that has the most non-zero components and initializing a vector W to be the complement of this first correlation vector;
   storing the test represented by the first correlation vector as a first test in the optimal sequence of tests;
   defining a multiplication of two correlation vectors to be a vector with components calculated from the logical AND operation of the corresponding components of the two correlation vectors;
   for each correlation vector of the remaining correlation vectors, calculating a product vector of the complement of each correlation vector and vector W using the multiplication definition in the previous element;
   calculating a projection length of each product vector onto the unit vector;
   finding a next correlation vector that is the correlation vector that has the smallest value of the projection length;
   storing the test represented by the next correlation vector as a test in the optimized sequence of tests;
   updating vector W to be the product of vector W and a compliment of the correlation vector in the previous step;
   repeating the previous five elements, until the length of the projection of vector W onto the unit vector is zero; and
   assigning the vector W to be the unit vector and repeating the previous six elements until there are no remaining vectors.

12. A method for reordering a sequence of N tests as an optimal sequence of tests for detecting faults in digital integrated circuits (IC's) when the execution times of the each tests in the sequence of N tests are not all the same, comprising:
   for each test of the sequence of N tests, compiling test results for L defective dice and storing the execution time of the sequence of N tests;
   representing each test of the sequence N tests as a correlation vector using a binary-valued L-dimensional vector, wherein bit j of correlation vector for test i is zero if device j passed test i;
   finding a first correlation vector of the N correlation vectors that has the largest value of the number of non-zero components divided by the execution time of the corresponding test and then initialize vector W to be a complement of this vector;
   storing the test represented by the first correlation vector as a first test in the optimal sequence of tests:
   defining the multiplication of two correlation vectors to be a vector with components that are calculated from the logical AND operation of the corresponding components of the two correlation vectors;

for each correlation vector of the remaining correlation vectors, calculating a length of a projection of the correlation vector onto vector W;

calculating a quotient of the calculated projection length in the previous step and the execution time of the corresponding test;

finding a next correlation vector that is the correlation vector that has the largest value of the quotient calculated in the previous step;

storing the test represented by the next correlation vector as a test in the optimized sequence of tests;

updating vector W to be the product of vector W and the compliment of the stored correlation vector in the previous step; and repeating the previous five elements, until the length of the projection of vector W onto the unit vector is zero.

13. A method for reordering a sequence of N tests as an optimal sequence of tests for detecting faults in digital integrated circuits (IC's) when the execution times of the tests in the sequence of N tests are not all the same, comprising:

for each test of a sequence of N tests, compiling test results for L defective dice and storing the execution time of the sequence of N tests;

representing each test of the sequence of N tests as a correlation vector using a binary-valued L-dimensional vector, wherein bit j of correlation vector for test i is zero if device j passed test i;

finding a first correlation vector of the N correlation vectors that has the largest value of the number of non-zero components divided by the execution time of the corresponding test and then initialize a vector W to be a complement of this vector;

storing the test represented by the first correlation vector as a first test in the optimal sequence of tests;

defining a multiplication of two correlation vectors to be a vector with components that are calculated from the logical AND operation of the corresponding components of the two correlation vectors;

for each correlation vector of the remaining correlation vectors, calculating a length of a projection of the correlation vector onto vector W;

calculating a quotient of the calculated projection length in the previous step and the execution time of the corresponding test;

finding a next correlation vector that is a correlation vector that has the largest value of the quotient calculated in the previous step;

storing the test represented by the next correlation vector as a test in the optimized sequence of tests;

updating vector W to be the product of vector W and a compliment of the stored correlation vector in the previous step;

repeating the previous five elements, until the length of the projection of vector W onto a unit vector is zero; and assigning vector W to be the unit vector and repeating the previous six elements until there are no remaining vectors.

* * * * *